(12) United States Patent
Jelinek et al.

(10) Patent No.: US 9,853,137 B2
(45) Date of Patent: Dec. 26, 2017

(54) METHOD FOR FORMING A SEMICONDUCTOR DEVICE AND A SEMICONDUCTOR DEVICE

(71) Applicant: Infineon Technologies AG, Neubiberg (DE)

(72) Inventors: Moriz Jelinek, Villach (AT); Johannes Georg Laven, Taufkirchen (DE); Helmut Oefner, Zorneding (DE); Hans-Joachim Schulze, Taufkirchen (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/935,830

(22) Filed: Nov. 9, 2015

(65) Prior Publication Data
US 2016/0141399 A1     May 19, 2016

(30) Foreign Application Priority Data

Nov. 14, 2014  (DE) .................. 10 2014 116 666

(51) Int. Cl.
| | |
|---|---|
| H01L 21/00 | (2006.01) |
| H01L 29/739 | (2006.01) |
| H01L 21/263 | (2006.01) |
| H01L 21/324 | (2006.01) |
| H01L 21/66 | (2006.01) |

(Continued)

(52) U.S. Cl.
CPC ........ H01L 29/7395 (2013.01); H01L 21/263 (2013.01); H01L 21/324 (2013.01); H01L 22/12 (2013.01); H01L 22/20 (2013.01); H01L 29/1095 (2013.01); H01L 29/36 (2013.01); H01L 22/14 (2013.01)

(58) Field of Classification Search
USPC .............................................. 438/7
See application file for complete search history.

(56) References Cited

U.S. PATENT DOCUMENTS

| | | |
|---|---|---|
| 2011/0124160 A1 | 5/2011 | Nemoto et al. |
| 2012/0231558 A1* | 9/2012 | Timans ............... G01J 5/0003 438/7 |

FOREIGN PATENT DOCUMENTS

| | | |
|---|---|---|
| DE | 102011003439 A1 | 8/2012 |
| JP | S486675 A | 1/1973 |

(Continued)

OTHER PUBLICATIONS

Auret, F. D. et al., "Deep Level Transient Spectroscopy of Defects in High-Energy Light-Particle Irradiated Si", Critical Reviews in Solid State and Materials Sciences, vol. 29, Issue 1, 2004, pp. 1-43.

(Continued)

*Primary Examiner* — Telly Green
(74) *Attorney, Agent, or Firm* — Murphy, Bilak & Homiller, PLLC

(57) ABSTRACT

A method for forming a semiconductor device comprises implanting a defined dose of protons into a semiconductor substrate and tempering the semiconductor substrate according to a defined temperature profile. At least one of the defined dose of protons and the defined temperature profile is selected depending on a carbon-related parameter indicating information on a carbon concentration within at least a part of the semiconductor substrate.

16 Claims, 8 Drawing Sheets

(51) Int. Cl.
*H01L 29/10* (2006.01)
*H01L 29/36* (2006.01)

(56) References Cited

FOREIGN PATENT DOCUMENTS

| JP | S526074 B1 | 2/1977 |
| JP | 2006352101 A | 12/2006 |
| JP | 2007250682 A | 9/2007 |
| JP | 2008211148 A | 9/2008 |
| JP | 2010034330 A | 2/2010 |
| WO | 2011125305 A | 10/2011 |
| WO | 2014181496 A1 | 11/2014 |

OTHER PUBLICATIONS

Carroll, Malcolm S., "The Interaction of Silicon Self-Interstitials and Substitutional Carbon in Silicon Based Heterostructures", A Dissertation Presented to the Faculty of Princeton University in Candidacy for the Degree of Doctor of Philosophy, Jun. 2001, selected pages.

Werner, P. et al., "Carbon Diffusion in Silicon", Applied Physics Letters, vol. 73, No. 17, Oct. 26, 1998, pp. 2465-2467.

\* cited by examiner

METHOD FOR FORMING A SEMICONDUCTOR DEVICE AND A SEMICONDUCTOR DEVICE

PRIORITY CLAIM

This application claims priority to German Patent Application No. 10 2014 116 666.3 filed on 14 Nov. 2014, the content of said application incorporated herein by reference in its entirety.

TECHNICAL FIELD

Embodiments relate to semiconductor manufacturing technologies and in particular to a method for forming a semiconductor device and a semiconductor device.

BACKGROUND

Many semiconductor devices comprise semiconductor substrates with regions of different conductivity types and different doping concentrations. The implementation of semiconductor substrates with different doping regions is often a challenging task. One way of generating donors within a semiconductor is an implant of protons to generate hydrogen-induced donors. It is desired to increase the doping efficiency of donors caused by proton implant.

SUMMARY

Some embodiments relate to a method for forming a semiconductor device. The method comprises implanting a defined dose of protons into a semiconductor substrate and tempering the semiconductor substrate according to a defined temperature profile. At least one of the defined dose of protons and the defined temperature profile is selected depending on a carbon-related parameter indicating information on a carbon concentration within at least a part of the semiconductor substrate.

Some further embodiments relate to a semiconductor device comprising at least one transistor structure. The transistor structure comprises an emitter or source terminal and a collector or drain terminal. Further, a carbon concentration within a semiconductor substrate region located between the emitter or source terminal and the collector or drain terminal varies between the emitter or source terminal and the collector or drain terminal.

Some embodiments relate to a method for forming semiconductor devices. The method comprises implanting a first defined dose of protons into a first semiconductor wafer and tempering the first semiconductor wafer according to a first defined temperature profile. At least one of the first defined dose of protons and the first defined temperature profile is selected depending on a carbon-related parameter indicating information on a first carbon concentration within at least a part of the first semiconductor wafer. Further, the method comprises implanting a second defined dose of protons into a second semiconductor wafer and tempering the second semiconductor wafer according to a second defined temperature profile. At least one of the second defined dose of protons and the second defined temperature profile is selected depending on a carbon-related parameter indicating information on a second carbon concentration within at least a part of the second semiconductor wafer. The first carbon concentration is different from the second carbon concentration.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
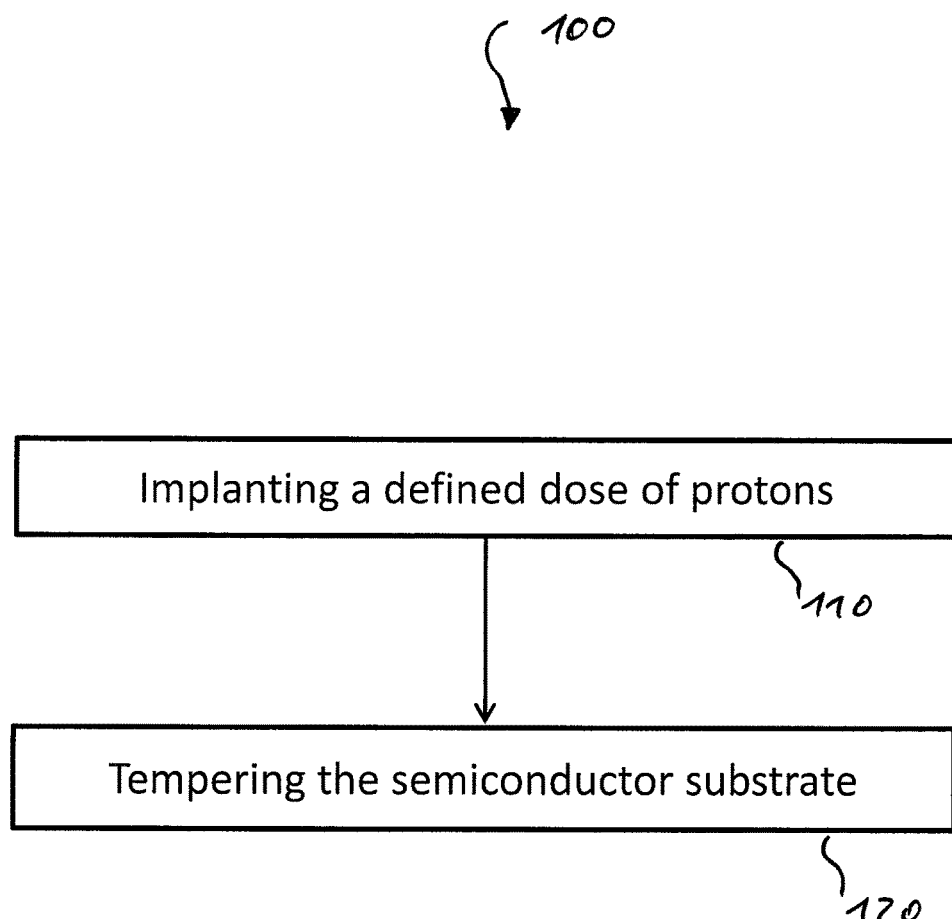
FIG. 1 shows a flow chart of a method for forming a semiconductor device.

FIG. 1 shows a flow chart of a method for forming a semiconductor device according to an embodiment. The method 100 comprises implanting 110 a defined dose of protons into a semiconductor substrate and tempering 120 the semiconductor substrate according to a defined temperature profile. At least one of the parameters defined dose of protons and defined temperature profile is selected depending at least on a carbon-related parameter indicating information on a carbon concentration within at least a part of the semiconductor substrate.

By selecting the dose of protons for implant and/or the temperature profile for the annealing after implant based on a carbon concentration within the semiconductor, the resulting doping concentration and/or doping distribution may be adjusted more accurate and/or more flexible. Further, substrates with high carbon concentration may be used. In this way, the doping efficiency may be increased.

Substitutional carbon Cs may be pushed out of the lattice and may become interstitial carbon Ci during the implant of the defined dose of protons. The protons may build up proton-induced donors (also called hydrogen-induced donors or shallow thermal donors) at the lattice vacancies prior occupied by the substitutional carbon Cs. The interstitial carbon Ci may built up CiOi-H complexes or CiO2i-H complexes (or other $C_xiO_xi$-H complexes) with oxygen and hydrogen available in the semiconductor. The CiOi-H complexes may have very low diffusion constant and may function as shallow thermal donors too. Therefore, the doping concentration may be increased by the CiOi-H complexes. Further, the CiOi-H complexes may bind free hydrogen which may otherwise build up higher-order hydrogen complexes at the lattice vacancies prior occupied by the substitutional carbon Cs which may reduce the number of thermal donors. In other words, the CiOi-H complexes may increase the doping concentration by binding free hydrogen.

The semiconductor device may be a silicon-based semiconductor device, a silicon carbide-based semiconductor device, a gallium arsenide-based semiconductor device or a gallium nitride-based semiconductor device, for example. The semiconductor substrate may be a silicon-based semiconductor substrate, a silicon carbide-based semiconductor substrate, a gallium arsenide-based semiconductor substrate or a gallium nitride-based semiconductor substrate, for example. The semiconductor substrate may be a wafer, a part of a wafer or a semiconductor die, for example.

The carbon may be incorporated in the semiconductor substrate in various ways. The carbon may be incorporated during the manufacturing of the semiconductor substrate itself (e.g., crystal growth or epitaxial deposition) or after manufacturing of the semiconductor substrate and before the proton implant.

For example, the carbon may be incorporated into the at least one part of the semiconductor substrate before implanting the defined dose of protons by implanting carbon into at least one part (e.g., field stop layer or drift layer) of the semiconductor substrate. The implant energy of the carbon implant may be selected so that a desired carbon concentration and/or carbon profile may be obtained within the semiconductor substrate.

Figure 7:
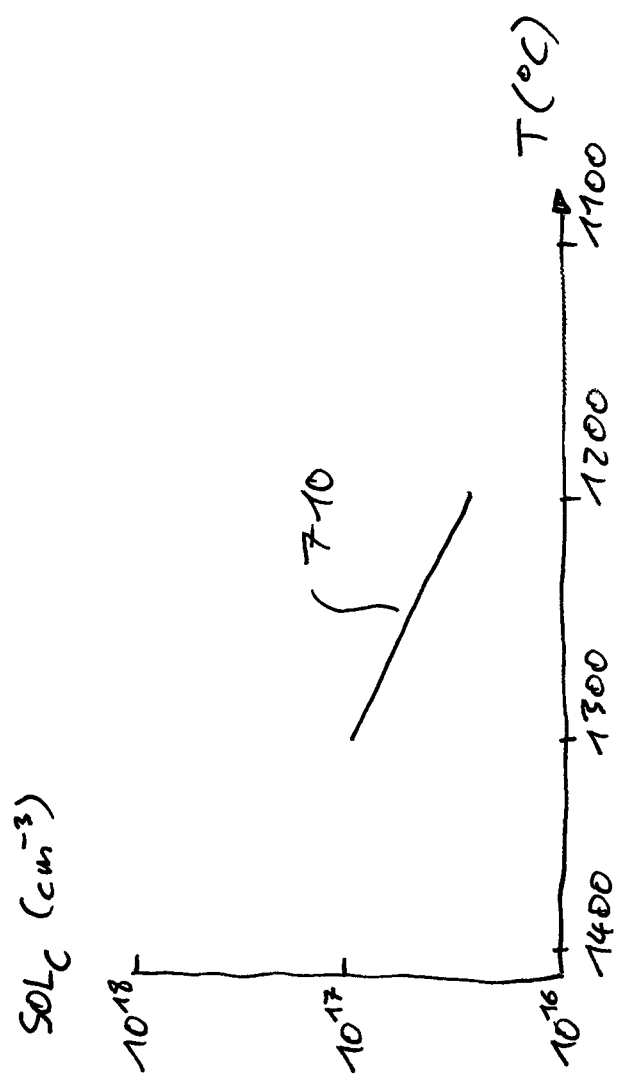
FIG. 7 shows the solubility of carbon in silicon.

Alternatively or additionally, the carbon may be incorporated into at least one part of the semiconductor substrate before implanting the defined dose of protons by diffusing carbon into at least one part of the semiconductor substrate. A diffusion temperature, diffusion time and/or provided amount of carbon for diffusion may be selected so that a desired carbon concentration and/or carbon profile may be obtained within the semiconductor substrate. For example, carbon exceeding the solubility limit of carbon at room temperature in the semiconductor substrate is provided during the diffusion process. The solubility limit of carbon 710 ($Sol_C$) in silicon for different temperatures is shown in FIG. 7.

Alternatively or additionally, the carbon may be incorporating by growing at least one part of the semiconductor substrate with a defined carbon distribution. In other words, the carbon may already be incorporated during the manufacturing of the semiconductor substrate itself (e.g., crystal growth or epitaxial deposition). In this way, a very homogeneous carbon concentration may be obtained throughout the whole semiconductor substrate or throughout a deposited layer- or grown part of the semiconductor substrate.

Independent from the method used for incorporating the carbon into the semiconductor substrate, a part of the carbon may be diffused out afterwards. In other words, additionally the method 100 may comprise diffusing carbon out of the semiconductor substrate by tempering the semiconductor substrate according to a defined diffusion temperature profile. For example, the semiconductor substrate may be heated to a predefined temperature for a predefined time in an atmosphere without carbon or with carbon at a low level (e.g., significantly below the solubility of carbon at this temperature) so that carbon diffuses out of the semiconductor substrate. In this way, a desired carbon profile (e.g., turtle-shaped profile) may be obtained.

For example, the carbon concentration (e.g., average carbon concentration or maximal carbon concentration) within at least one part of the semiconductor substrate may be higher than $1*10^{15}$ cm$^{-3}$ (or higher than $1*10^{14}$ cm$^{-3}$ or higher than $5*10^{15}$ or even higher than $1*10^{16}$ cm$^{-3}$).

Alternatively or additionally, the carbon concentration (e.g., average carbon concentration or maximal carbon concentration) may be kept below an upper limit to control or minimize the described effect. For example, the carbon concentration within at least one part of the semiconductor substrate may be lower than $1*10^{15}$ cm$^{-3}$ (or lower than $1*10^{14}$ cm$^{-3}$ or lower than $5*10^{15}$).

The defined dose of protons may be implanted with a single implant energy or may be distributed over several implant energies or implant energy ranges resulting in implant maxima at one or more depths within the semiconductor substrate. For example, the defined dose of protons is higher than $1*10^{13}$ cm$^{-2}$, $1*10^{14}$ cm$^{-2}$ (or higher than $1*10^{15}$ cm$^{-3}$ or higher than $5*10^{15}$ cm$^{-3}$).

The defined dose of protons may be implanted from a front side of the semiconductor substrate. A front side of the semiconductor substrate may be a side of the semiconductor substrate at which the more complex structures are to be manufactured (e.g., transistor structures and/or wiring) while the back side of the semiconductor substrate may be a side of the semiconductor substrate at which less complex structures are to be manufactured (e.g., transistor structures and/or wiring).

For example, the defined dose of protons is implanted 110 into a semiconductor substrate to generate a defined concentration of interstitial carbon in at least one part of the semiconductor substrate.

The tempering 120 may be done with the defined temperature profile or temperature ramp. The defined temperature profile may define the course of the temperature over time during the tempering of the semiconductor substrate. The defined temperature profile may comprise a maximal temperature below or less than 500° C. (or less than 550° C. or less than 450° C.). The proton-induced donors may be activated during the tempering 120.

The realization of the proton-induced donors and the subsequent process steps for the realization of the power devices may be performed at temperatures below 500° C. (or below 550° C. or below 450° C.) after the implant 110 of the defined dose of protons. In this way, diffusion or a change of the carbon distribution and/or hydrogen-induced donors may be avoided or kept low. Optionally, a laser process in a melting or non-melting mode may be performed at the wafer backside (e.g., for the activation of a backside emitter for IGBTs or an emitter for diodes or a drain zone for Power MOSFETs) after the proton irradiation which may be uncritical for the proton-induced doping due to the strong localization of the temperature maximum close to the wafer backside, for example.

The defined dose of protons and/or the defined temperature profile is selected or predefined depending on a carbon-related parameter indicating information on a carbon concentration within at least a part of the semiconductor substrate (e.g., an average or maximal carbon concentration within a region of interest, for example, drift zone or field stop, or within the whole semiconductor substrate).

The carbon-related parameter may be the carbon concentration itself (e.g., average or maximal carbon concentration) or a parameter proportional to the carbon concentration or enabling a determination of the carbon concentration, for example. For example, the carbon-related parameter may be an electrical resistance or doping concentration of the semiconductor substrate before the implant or of a comparable wafer (e.g., from the same piece of grown semiconductor crystal) after implant. The electrical resistance or doping concentration of the semiconductor substrate may be information indicating a carbon concentration, since these parameters may be proportional to the carbon concentration or may enable the determination of the carbon concentration.

For example, the method may optionally comprise measuring a carbon concentration (or another parameter indicating the carbon concentration) of at least a part of the semiconductor substrate or a carbon concentration (or another parameter indicating the carbon concentration) of at least a part of another semiconductor substrate manufactured together with the semiconductor substrate of the semiconductor device to be formed. The carbon concentration may be measured directly or indirectly (e.g., space-resolved deep-level transient spectroscopy and/or infrared measurement or measuring an electrical resistance or doping concentration of the semiconductor substrate).

For example, one or more forerunner wafers (e.g., 3) or one or more test wafers may be fully or partly processed. For example, the thermal budget of the full process may be done (e.g., omitting the trench etching) and a proton implantation. The forerunner wafers or test wafers may be measured (e.g., by IR, DLTS, Spreading resistance profiling SRP or electrical measurement) to determine the doping concentration, for example, and adapting the process for the remaining wafers. In other words, the method may further comprise processing one or more test wafers and determining a carbon-related parameter of one or more of the test wafers. Further, further wafers may be processed based on the determined carbon-related parameter.

Additionally, the method 100 may optionally further comprise implanting electrons, alpha particles, helium or further protons into the semiconductor substrate with a defined energy distribution to generate interstitial semiconductor atoms with a defined depth distribution. In this way, the number of resulting CiOi-H complexes may be further increased.

A large variety of semiconductor devices may be manufacturable according to the proposed concept or one or more embodiments described above or below. For example, semiconductor devices with one or more transistor structures may be manufactured based on the proposed concept. For example, power semiconductor devices (e.g., insulated gate bipolar transistor IGBT or a vertical field effect transistor) or diodes may be manufactured based on the proposed concept. For example, a power semiconductor device may comprise a blocking voltage above 100V (or above 500V, above 1000V or above 1500V, e.g., 600V, 1200V or 1700V).

Figure 2:
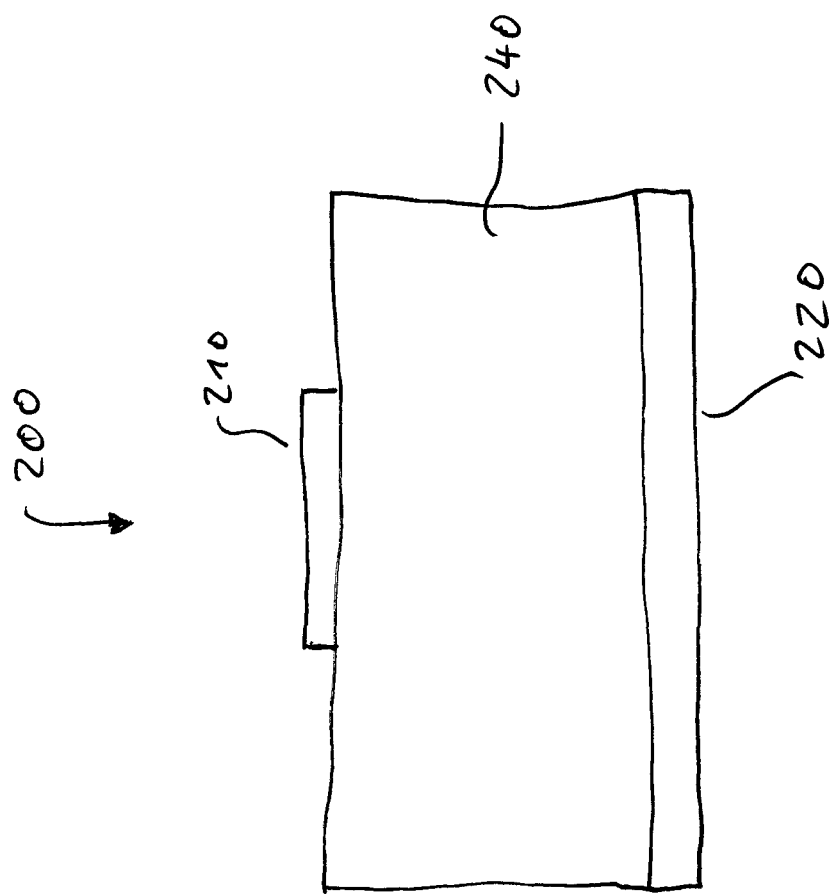
FIG. 2 shows a schematic cross section of a semiconductor device.
Figure 2:
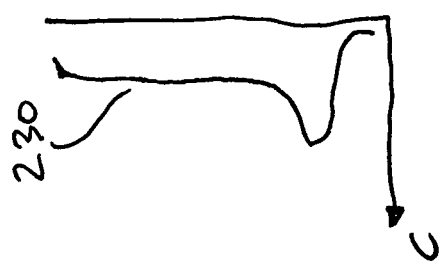

FIG. 2 shows a schematic cross section of a semiconductor device according to an embodiment. The semiconductor device 200 comprises at least one transistor structure. The transistor structure comprises an emitter or source terminal 210 and a collector or drain terminal 220. A carbon concentration 230 within a semiconductor substrate 240 located between the emitter or source terminal 210 and the collector or drain terminal 220 varies between the emitter or source terminal 210 and the collector or drain terminal 220.

An additional degree of freedom for implementing a desired doping profile of transistors may be provided by implementing a carbon concentration varying between the terminals of the transistor. Additionally or alternatively, less protons may be necessary to reach a desired doping concentration, if the carbon concentration is increased so that the doping efficiency may be increased.

At least one transistor structure may be a bipolar transistor structure with a collector terminal, an emitter terminal and a base terminal, may be a field effect transistor structure comprising a source terminal, a drain terminal and a gate terminal or may be an insulated gate bipolar transistor structure comprising an emitter terminal, a collector terminal and a gate terminal, for example.

The emitter or source terminal 210 and the collector or drain terminal 220 may be terminals enabling an electrical connection to other terminals on the semiconductor device or to terminals of an external device. For example, the emitter or source terminal 210 may be an emitter or source implant region, a pad connected to the emitter or source implant region or a front side metal layer connected to the emitter or source implant region. For example, the collector or drain terminal 220 may be a collector or drain implant region, a pad connected to the collector or drain implant region or a back side metal layer connected to the collector or drain implant region.

An example for a varying carbon concentration is shown next to the cross section of FIG. 2. The local carbon concentration varies for different depths within the semiconductor substrate of the semiconductor device 200. For example, the carbon concentration may vary between $1*10^{14}$ cm$^{-3}$ and $2*10^{16}$ cm$^{-3}$ (or between $1*10^{14}$ cm$^{-3}$ and $1*10^{17}$ or between $1*10^{15}$ cm$^{-3}$ and $5*10^{15}$ cm$^{-3}$). For example, the carbon concentration profile between the emitter or source terminal 210 and the collector or drain terminal 220 comprises a maximal carbon concentration of less than $2*10^{16}$ cm$^{-3}$ and a minimal carbon concentration of more than $1*10^{14}$ cm$^{-3}$. For example, a maximal carbon concentration of the carbon concentration profile may be more than twice (or more than 10 times or more than 50 times) a minimal carbon concentration of the carbon concentration profile.

For example, the semiconductor device 200 may comprise an increased carbon concentration within a drift layer or drift zone of the transistor structure in comparison to other regions of the semiconductor substrate of the semiconductor device 200 or may comprise an increased carbon concentration within a field stop layer or field stop zone of the transistor structure in comparison to a drift layer or drift zone of the transistor structure.

The semiconductor device may comprise a thin semiconductor substrate. For example, the semiconductor substrate of the semiconductor device comprises a thickness of less than 200 µm (or less than 150 µm, less than 100 µm or less than 80 µm). For example, carbon may be diffused into the semiconductor substrate from the backside (e.g., into a field stop zone of the semiconductor device) and/or at least a part of a defined dose of protons may be implanted from the back side of the semiconductor substrate.

Alternatively, the carbon atoms can be implanted from the front side. For example, this implantation step may be performed at the beginning of the fabrication process so that a deep in-diffusion of the carbon atoms can be achieved. Optionally, an additional high temperature step can be performed between the carbon implantation step and the fabrication processes required for the realization of the power device to obtain a deeper penetration depth of the in-diffused carbon atoms, for example.

More details and aspects of the semiconductor device 200 (e.g., semiconductor substrate, implementing a varying carbon concentration) are mentioned in connection with the proposed concept or one or more examples described above or below (e.g., FIG. 1 or 3 to 6). The semiconductor device 200 may comprise one or more optional features in addition corresponding to one or more aspects of the proposed concept or one or more examples described above or below.

Figure 3:
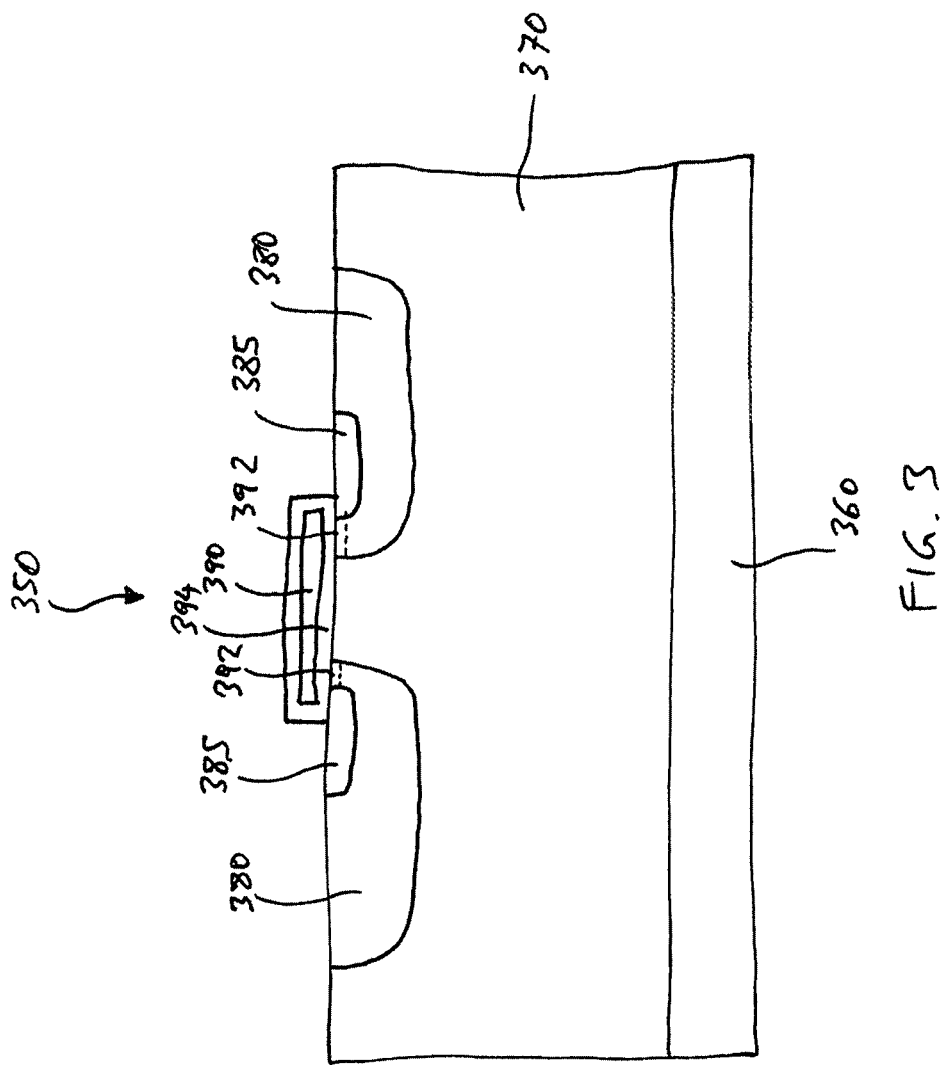
FIG. 3 shows a schematic cross section of an insulated gate bipolar transistor structure.

FIG. 3 shows a schematic cross-section of a part of an insulated gate bipolar transistor arrangement 350 representing a transistor structure of a semiconductor device according to an embodiment. The insulated gate bipolar transistor arrangement 350 comprises a semiconductor structure (e.g., silicon-based or silicon carbide-based) comprising a collector layer 360, a drift layer 370, a plurality of body areas 380, a plurality of source areas 385 and a gate 390 of a plurality of gates 390 (e.g., of similar or equal structures distributed over the insulated gate bipolar transistor arrangement). The plurality of source areas 385 and the drift layer 370 comprise at least mainly a first conductivity type (e.g., n or p) and the plurality of body areas 380 and the collector layer 360 comprise at least mainly a second conductivity type (e.g., p or n). The plurality of gates 390 are arranged so that the gates 390 are capable of causing a conductive channel 392 between the source areas 385 and the drift layer 370 through the body areas 380. The gates 390 may be electrically insulated from at least the body areas 380 by an insulation layer 394 (e.g., gate oxide layer).

The body areas 380 and the collector layer 360 comprise the second conductivity type which can be a p-doping (e.g., caused by incorporating aluminum ions or boron ions) or an n-doping (e.g., caused by incorporating nitrogen ions, phosphor ions or arsenic ions). Consequently, the second conductivity type indicates an opposite n-doping or p-doping. In other words, the first conductivity type may indicate an n-doping and the second conductivity type may indicate a p-doping or vice-versa.

The plurality of gates 390 may be arranged so that the gates 390 cause a conductive channel 392 between the source areas 385 and the drift layer 370 through the body areas 380 according to a field effect transistor principle. In other words, the plurality of gates 390 are arranged in the proximity of the body areas 380 but electrically insulated from the body area 380 by an insulation layer 390 so that a conductive channel 392 between the source areas 385 and the drift layer 370 can be controlled by a voltage applied to the gates 390.

In other words, the transistor structure may comprise a drift layer 370 located between the emitter or source terminal 210 and the collector or drain terminal 220. Optionally, the transistor structure may comprise also a field stop layer located between the drift layer 370 and the collector or drain terminal 220. The field stop layer (also called field stop zone) may comprise an average carbon concentration of at least twice (or at least 10 times or at least 50 times) an average carbon concentration of the drift layer 370, for example. This may be realized e.g., by a carbon implantation step with a subsequent drive-in step or by epitaxial deposition techniques.

A semiconductor device 200 may comprise mainly or only the insulated gate bipolar transistor arrangement or may comprise further electrical elements or circuits (e.g., control unit for controlling the insulated gate bipolar transistor arrangement or a power supply unit).

More details and aspects of a semiconductor device with one or more insulated gate bipolar transistor arrangements 350 (e.g., semiconductor substrate, implementing a varying carbon concentration) are mentioned in connection with the proposed concept or one or more examples described above or below (e.g., FIG. 1 to 2 or 4 to 6). The semiconductor device shown in FIG. 3 may comprise one or more additional optional features corresponding to one or more aspects of the proposed concept or one or more examples described above or below.

For example, the defined dose of protons mentioned in connection with one or more embodiments above or below (e.g., FIG. 1) may be implanted into the semiconductor substrate by implanting a defined dose of protons into a drift layer region of the semiconductor device to be formed.

Additionally or alternatively, carbon may be implanted or diffused or incorporated by epitaxial techniques into a field stop layer region of the semiconductor device to be formed so that an average carbon concentration within the drift layer region is lower than an average carbon concentration within the field stop layer region.

For example, the drift layer region and the field stop layer region may be formed by two independent implant and annealing processes. The implant process for the drift layer may comprise an implant of protons with one or more implant energies and the annealing process for the drift layer may comprise tempering according to a defined temperature profile (e.g., with a maximal temperature of substantially 490° C.). The implant process for the field stop layer may comprise an implant of protons with one or more implant energies and the annealing process for the field stop layer may comprise tempering according to a defined temperature profile (e.g., with a maximal temperature of substantially 400° C. or 420° C.).

Figure 4:
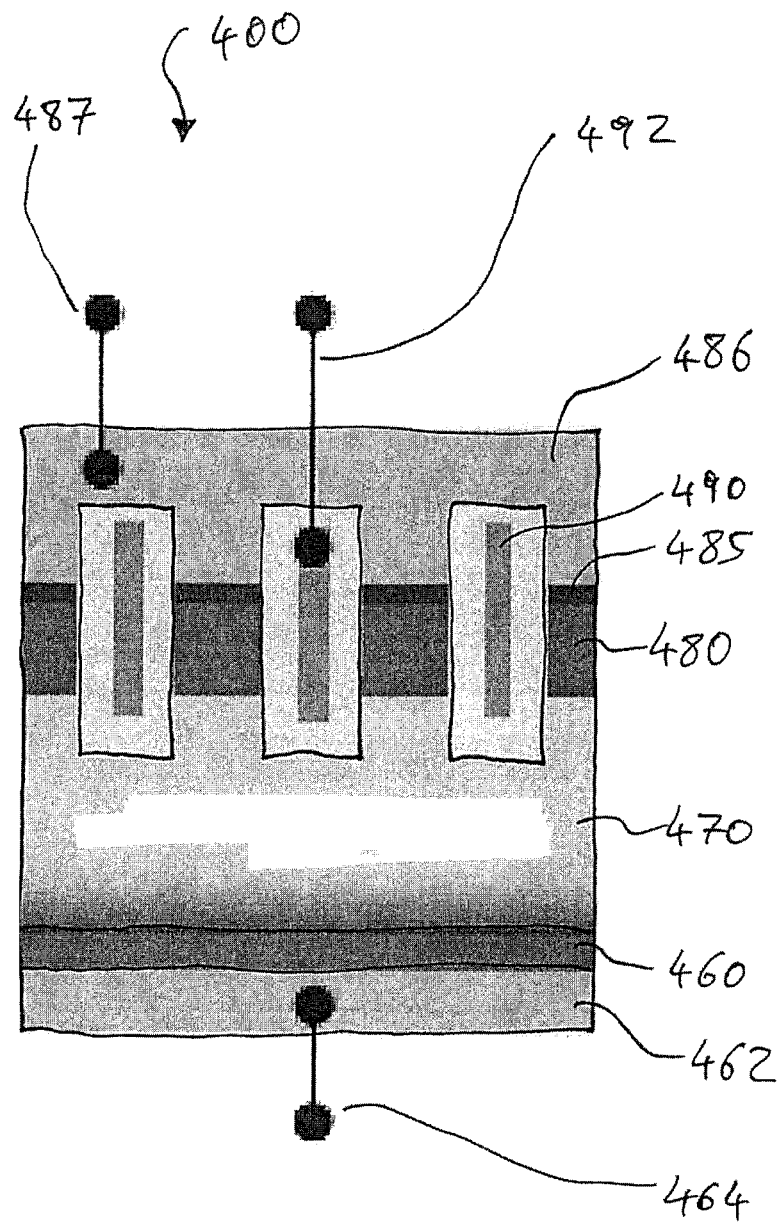
FIG. 4 shows a schematic cross section of a Mesa-insulated gate bipolar transistor structure.

FIG. 4 shows a schematic cross section of a Mesa-insulated gate bipolar transistor structure 400. The Mesa-insulated gate bipolar transistor structure 400 comprises a collector layer 460 (e.g., doping concentration of 1e16 to 1e18/cm$^2$) and a backside collector metal layer 462 for an electrical contact 464 to the collector layer 460 of the Mesa-insulated gate bipolar transistor structure 400 at a backside of the Mesa-insulated gate bipolar transistor structure 400. Further, the Mesa-insulated gate bipolar transistor structure 400 comprises a drift layer 470 adjacent to the collector layer 460 and a body layer (e.g., deposited or implanted) comprising body areas 480 (e.g., doping concentration of 1e17 to 1e19/cm$^2$) adjacent to the drift layer 470 (e.g., doping concentration of 5e12 to 1e14/cm$^2$). Additionally, the Mesa-insulated gate bipolar transistor structure 400 comprises source areas 485 in contact to a source metal layer 486 for an electrical contact 487 adjacent to the body areas 480. Additionally, also the body areas 480 may be in contact to a source metal layer 486, for example. Further, trenches comprising gates 490 (e.g., poly silicon gates) reaching vertically through the body layer are arranged with predefined lateral distance to each other. The gates can be electrically connected through a gate wiring 492 (not shown). Optionally, the Mesa-insulated gate bipolar transistor structure 400 may comprise a field stop layer between the drift layer 470 and the collector layer 460.

The Mesa-insulated gate bipolar transistor structure 400 comprises body areas representing Mesa structures. A Mesa structure comprises a significantly larger (e.g., more than 5 times larger or more than 10 times larger) dimension in one lateral direction than in another lateral direction (e.g., orthogonal lateral direction).

More details and aspects of a semiconductor device with one or more Mesa-insulated gate bipolar transistor structures 400 (e.g., semiconductor substrate, implementing a varying carbon concentration) are mentioned in connection with the proposed concept or one or more examples described above or below (e.g., FIG. 1 to 3 or 5 to 6). The semiconductor device shown in FIG. 4 may comprise one or more additional optional features corresponding to one or more aspects of the proposed concept or one or more examples described above or below.

Figure 5:
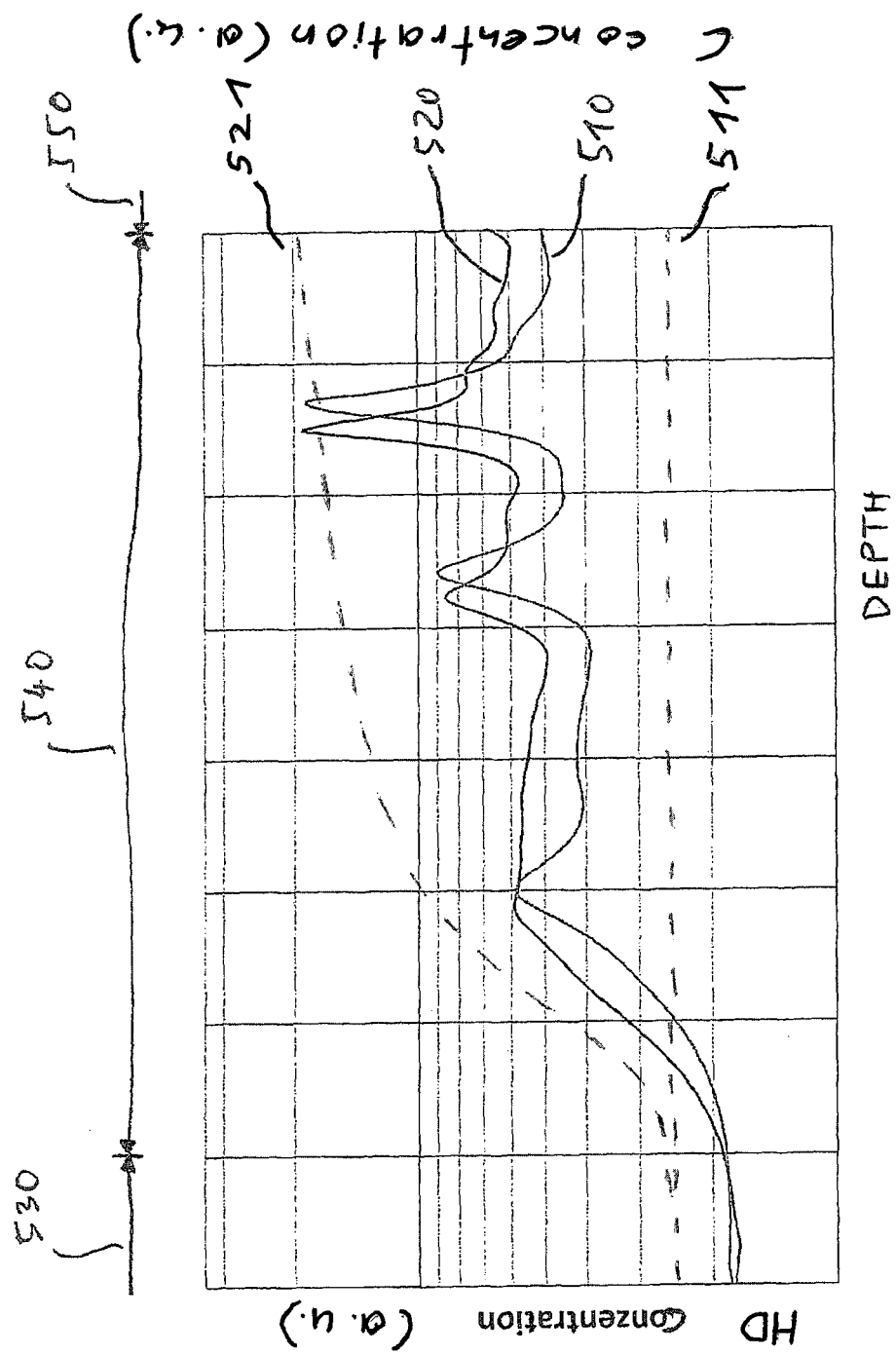
FIG. 5 shows field stop profiles with corresponding carbon distributions.

FIG. 5 shows examples of two possible distributions 511 and 521 of carbon within a semiconductor substrate in the region of the field stop layer 540. The field stop layer 540 may comprise a thickness between 3 μm and 50 μm or between 5 and 30 μm and may be located between a drift layer 530 (e.g., thickness between 40 μm and 220 μm depending on the blocking voltage of the semiconductor device to be formed) and a collector layer 550 (e.g., comprising a thickness between 200 nm and 500 nm).

The diagram indicates the variation of the concentration of hydrogen induced donors HD and carbon concentration (in arbitrary units) over the depth (in arbitrary units) measured orthogonal to a front side or back side of the semiconductor substrate.

The semiconductor device shown in FIG. 3, 4, or 5 may comprise a field stop zone with a field stop profile 520 shown in FIG. 5.

FIG. 5 shows a comparison of a conventionally generated proton field stop profile 510 (concentration of hydrogen induced donors HD) with a corresponding carbon distribution 511 with an example of a proposed field stop profile 520 (concentration of hydrogen induced donors HD) and corresponding carbon distribution 521 respectively. Profile 521 shows a supportive CiOi-H-related doping induced by the incorporation of additional carbon 521. In this simulation, the implanted doping dose and annealing conditions were the same. Alternatively, the carbon concentration can be intentionally approximately homogeneously enhanced over the whole vertical extent of the wafer to obtain a higher doping level for the field stop zone and a smaller difference between the doping concentration of the doping peaks and the neighbouring minima (e.g., resulting in an improved smoothness of the field stop profile and with it in an improved softness during turn-off of the devices) for given implantation doses and annealing conditions, for example.

Figure 6:
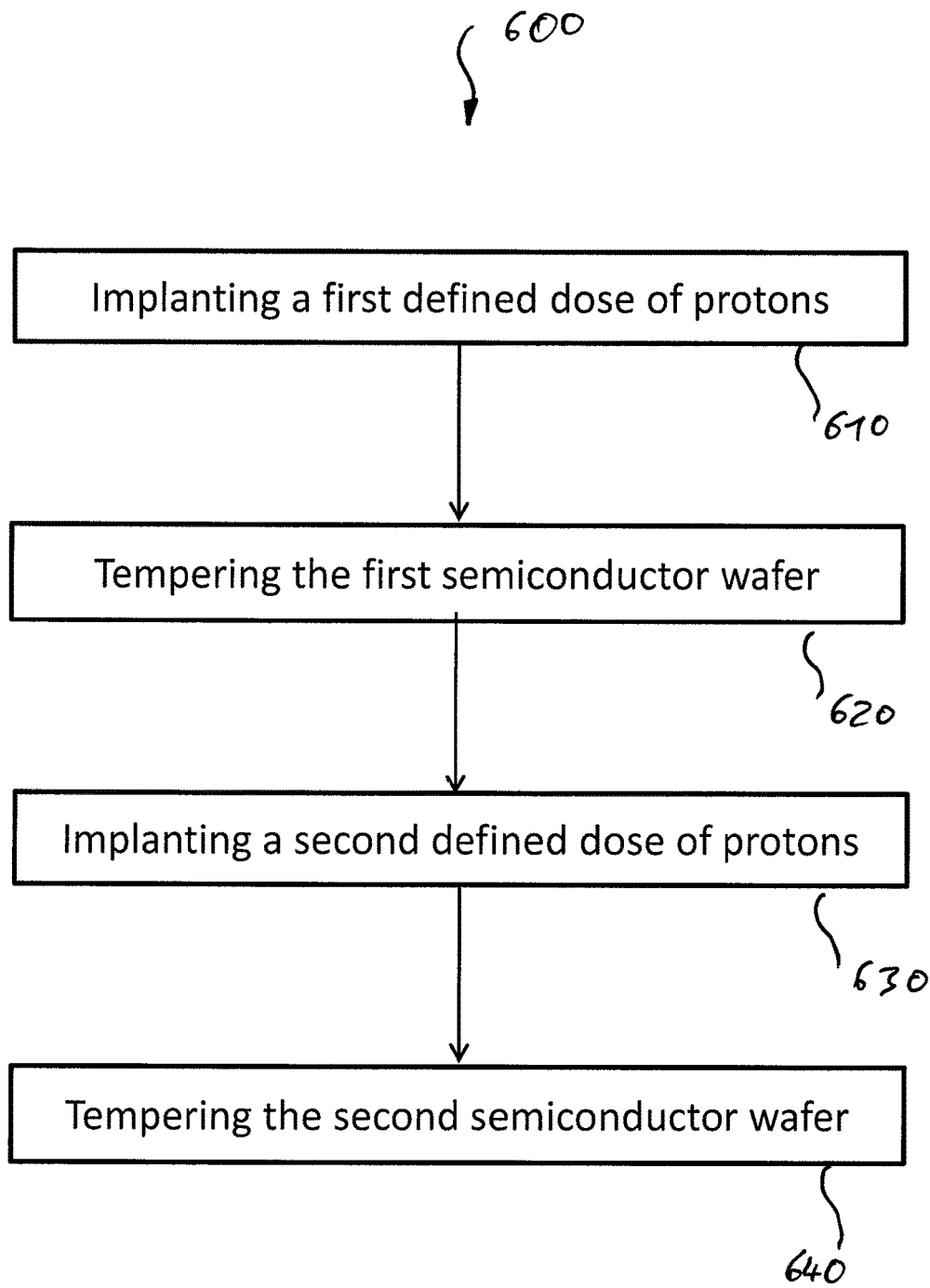
FIG. 6 shows a flow chart of a method for forming a semiconductor device.

FIG. 6 shows a flow chart of a method for forming a semiconductor device. The method 600 comprises implanting 610 a first defined dose of protons into a first semiconductor wafer and tempering 620 the first semiconductor wafer according to a first defined temperature profile. At least one of the first defined dose of protons and the first defined temperature profile is selected depending on a carbon-related parameter indicating information on a first carbon concentration within at least a part of the first semiconductor wafer. Further, the method 600 comprises implanting 630 a second defined dose of protons into a second semiconductor wafer and tempering 630 the second semiconductor wafer according to a second defined temperature profile. At least one of the second defined dose of protons and the second defined temperature profile is selected depending on a carbon-related parameter indicating information on a second carbon concentration within at least a part of the second semiconductor wafer. Further, the first carbon concentration is different from the second carbon concentration (e.g., by more than 10% of the first carbon concentration, more than 50% of the first carbon concentration or at least by a factor of 2 for a mean value).

By adapting the defined dose of protons to be implanted and/or the defined temperature profile used for tempering the semiconductor wafer based on the carbon concentration of the semiconductor wafer, it may be enabled to use semiconductor substrates with different carbon concentration for forming different semiconductor devices or same semiconductor devices.

More details and aspects of the method 600 (e.g., semiconductor wafer, implementing a varying carbon concentration, incorporating carbon, carbon related parameter) are mentioned in connection with the proposed concept or one or more examples described above or below (e.g., FIG. 1 to 5). The method 600 may comprise one or more additional optional features corresponding to one or more aspects of the proposed concept or one or more examples described above or below.

Some embodiments relate to a method for increasing the doping efficiency of proton irradiation. An increase of the doping efficiency and/or an adjustment of the profile shape of the so called proton doping may be achieved by a targeted addition of a defined carbon concentration in the semiconductor crystal.

For example, the doping efficiency of donors produced by a proton irradiation in combination with a suitable tempering may be increased in order to reduce the required proton dose and consequently the process costs and/or to increase the degree of freedom for adjusting different doping profile shapes.

For example, a defined carbon concentration may be inserted into the region of the drift zone of a device to be doped (e.g., IGBT) in order to increase the donor concentration achievable by a specific proton dose and tempering through the generation of Ci-Oi-H complexes resulting from a suitable annealing process.

Figure 8:
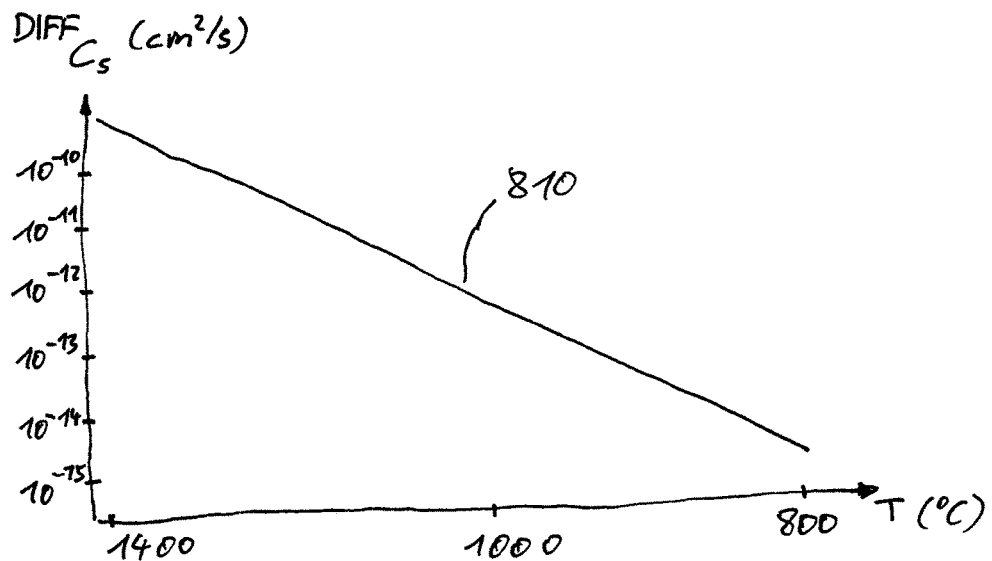
FIG. 8 shows the diffusion coefficient of substitutional carbon Cs in silicon.

According to an aspect, carbon may be diffused to the depth of the field stop (e.g., from the front side), for example, controlled by the solid state solubility of substitutional carbon in silicon so that a sufficient reproducibility and lateral homogeneity of the doping concentration in the drift zone may exist. The diffusion constant of substitutional carbon is shown in FIG. 8. Additionally, interstitial carbon may be used for utilization of the desired effect (e.g., increasing implant efficiency).

The carbon diffusion (into the semiconductor) may be integrated in the process sequence so that the incorporated carbon is diffused deep enough into the semiconductor wafer and is not significantly diffused out afterwards, for example. According to an aspect, the substitutional carbon is diffused (into the semiconductor) at the beginning of the process.

Alternatively, the carbon may be incorporated in the silicon at the beginning of the processing. For example, this may be achieved by a corresponding addition of carbon during the crystal growth process. The starting concentration of carbon may be determined, if the solid state solubility of carbon in silicon is underrun. This may be done by an infrared (IR) measurement or alternatively by a forerunner wafer used for determining the doping change due to the present carbon at a proton implant. The measurement result may be transferred to a larger number of wafers due to the known segregation behavior of carbon.

Alternatively, the carbon may be deposited on to the wafer by an epitaxial layer. The carbon may be incorporated in a defined way in the layer profile during the growth. A variety of possible doping profiles may be implemented by a targeted vertical variation of the carbon concentration.

The carbon may mainly (e.g., more than 90% or more than 99%) exist in its substitutional form within the silicon crystal lattice prior to the proton implantation step. In this way, it may be achieved that the additionally incorporated donor concentration may be proportional to the implant and tempering parameters so that a reproducible effect may be achieved.

Interstitial silicon atoms may be generated additionally to the proton-induced donors and lattice vacancies during the proton implant and the following tempering step (e.g., at temperatures between 300° C. and 550° C. or between 350° C. and 500° C.). The interstitial silicon atoms may diffuse with a comparable fast diffusion constant already at room temperature. The existing substitutional carbon may function as a getter center for the free interstitial silicon atoms, thus interstitial carbon Ci may be generated. The transfer from Cs to Ci can be also induced by the energy transfer of the implanted protons. The interstitial carbon may in turn build up desired CiOi-H complexes with available oxygen and the implanted hydrogen. The process may be limited to the initial concentration and distribution of the substitutional carbon Cs, since the concentration of interstitial oxygen Oi within a utilized substrate may be higher than the concentration of substitutional carbon Cs. In this way, the resulting doping profile may be adjustable with an additional degree of freedom. For example, the CiOi-H donors may be generated in a defined depth and/or profile additionally to the proton-induced donors and may as a consequence effectively increase and/or stabilize the doping efficiency of the proton doping. For example, the concentration of interstitial oxygen Oi may be larger than $1*10^{17}$ cm$^{-3}$ and the concentration of substitutional carbon Cs may be lower than $1*10^{16}$ for MCZ (magnetic-field-induced Czochralski) substrate.

Alternatively or additionally, the effect may be controlled by a targeted adjustment of the interstitial carbon Ci profile. For example, interstitial carbon Ci may be generated after a diffusion of substitutional carbon Cs by an irradiation with electrons, alpha particles, helium or protons. The depth of the maximal effect may be controlled by the energy of the irradiation, for example. Alternatively, the interstitial carbon Ci concentration diffused into the substrate may be utilized which may be determined by the diffusion parameters of carbon and the final thickness of the substrate, for example.

The influence of the surface as a drain for the carbon, or during the proton implant to the distribution of the interstitial silicon atoms may be used for the adjustment of the profile shape of the interstitial carbon Ci.

For example, turtle-shaped doping profiles (or other shapes) may be generated (e.g., in the drift zone) by combined in- and out diffusion of carbon. For example, the doping maximum of the drift zone doping may be located approximately at half of the depth of the drift zone (e.g., in the middle third of the drift zone or between 40% and 60% of the depth of the drift layer) to improve the switch-off properties. Alternatively, the doping maximum may be shifted to another position of the drift zone by a suitable selection of the parameters of diffusion of carbon into the substrate or out of the substrate.

For example, also a targeted gradient of the drift zone doping may be adjusted by implementing a defined profile of carbon atoms diffusing into the substrate by the parameters of diffusion of carbon into the substrate or out of the substrate (e.g., annealing temperature or time). For example, the switch-off process of power semiconductors, the blocking capability and/or the cosmic radiation stability may be improved or optimized by a defined presetting of a gradient for the drift zone profile or by the implementation of a turtle-shaped doping profile.

According to an aspect, the doping efficiency of proton-induced field stop zones may be improved by a defined front side diffusion of carbon atoms into the substrate. In this way, the waviness or ripple of profiles of multi-step field stop zones generated by multiple implantations utilizing several implant energies may be significantly reduced, for example. This may be explained on one hand by the gradual course of the carbon concentration and the consequently induced additional doping and on the other hand by the reduced vacancy concentration between the doping maxima which significantly facilitate the transition from substitutional carbon to interstitial carbon. An example for a doping profile smoothed by carbon incorporation is shown in FIG. 5.

According to an aspect, the proposed drift zone doping and/or field stop doping may be implemented within material pre-doped with donor atoms like e.g., phosphorus, arsenic or antimony during the crystal growth or by neutron transmutation doping, for example.

Figure 9:
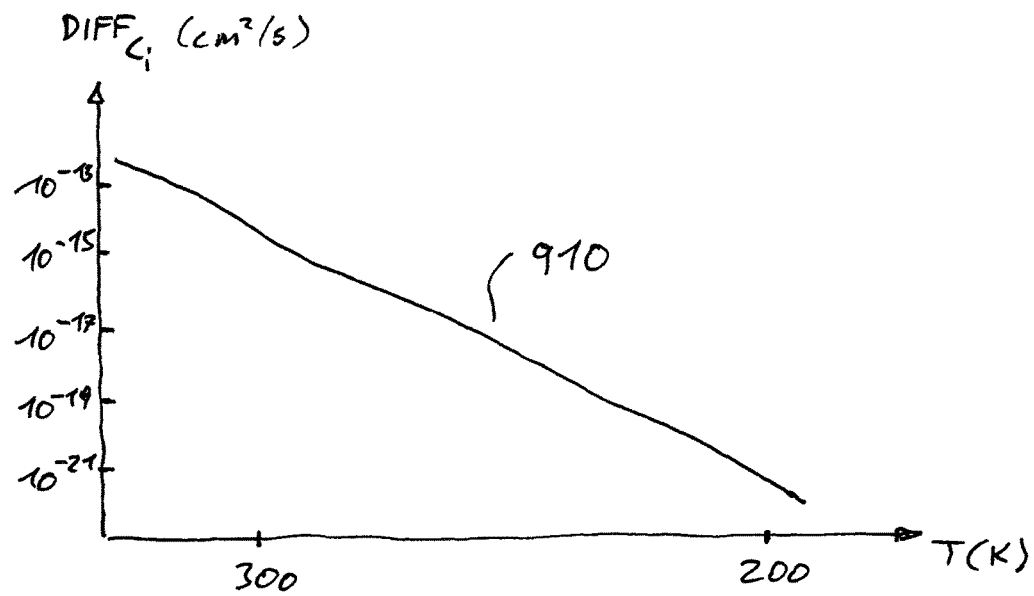
FIG. 9 shows the diffusion coefficient of interstitial carbon Ci in silicon.

Alternatively or additionally, carbon may be diffused into the substrate from the wafer back side. The diffusion constant of the substitutional carbon for larger wafer diameters (e.g., 8" or 12") for thin wafers may be too low so that the carbon may be diffused into the substrate interstitially and therefore with low solubility. The diffusion constant of interstitial carbon 910 exceeds the diffusion constant of substitutional carbon 810 by several orders of magnitude (e.g., FIGS. 8 and 9).

Additionally or alternatively, carbon may be incorporated targeted in a defined depth during epitaxy. The epitaxy process may be interrupted once or several times to generate a variety of profiles. The carbon can be introduced from the gas phase during the epitaxial deposition or/and by carbon implantation steps prior to the epitaxial deposition and/or during the interruptions of the epitaxial deposition.

The correlation of the course of the doping profile with the content of carbon in defined positions of the device (e.g., vertical profile courses) may be done with space-resolved DLTS (deep-level transient spectroscopy) and/or IR (infrared) measurements.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure.

Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
   providing a semiconductor substrate having a carbon concentration within at least a part of the semiconductor substrate;
   determining a carbon-related parameter by performing a measurement indicating information on the carbon concentration within the at least a part of the semiconductor substrate;
   implanting a defined dose of protons into a semiconductor substrate; and
   tempering the semiconductor substrate according to a defined temperature profile
   wherein at least one of the defined dose of protons and the defined temperature profile is dependent upon the carbon-related parameter.

2. The method according to claim 1, wherein the carbon concentration within at least one part of the semiconductor substrate is higher than $1*10^{15}$ cm$^{-3}$.

3. The method according to claim 1, further comprising incorporating carbon into at least one part of the semiconductor substrate before implanting the defined dose of protons.

4. The method according to claim 3, wherein incorporating the carbon comprises implanting carbon or diffusing carbon into at least one part of the semiconductor substrate.

5. The method according to claim 3, wherein incorporating the carbon comprises diffusing carbon into at least one part of the semiconductor substrate, wherein more carbon than the solubility of carbon at room temperature in the semiconductor substrate is provided during the diffusion process.

6. The method according to claim 1, further comprising diffusing carbon out of the semiconductor substrate by tempering the semiconductor substrate according to a defined diffusion temperature profile.

7. The method according to claim 1, further comprising incorporating the carbon during crystal growth or during deposition of an epitaxial layer into the at least one part of the semiconductor substrate with a defined carbon distribution.

8. The method according to claim 1, wherein the defined dose of protons is higher than $1*10^{14}$ cm$^{-2}$.

9. The method according to claim 1, wherein the defined temperature profile comprises a maximal temperature of less than 500° C.

10. The method according to claim 1, wherein the subsequent manufacturing processes of the semiconductor device are performed at temperatures below 500° C. after the implant of the defined dose of protons.

11. The method according to claim 1, wherein determining the carbon related parameter comprises measuring a carbon concentration of at least a part of the semiconductor substrate or a carbon concentration of at least a part of another semiconductor substrate manufactured together with the semiconductor substrate of the semiconductor device to be formed.

12. The method according to claim 1, further comprising implanting electrons, alpha particles, helium or further protons into the semiconductor substrate with a defined energy distribution to generate interstitial semiconductor atoms with a defined depth distribution.

13. The method according to claim 1, wherein the defined dose of protons is implanted into the semiconductor substrate to generate a defined concentration of interstitial carbon in the at least one part of the semiconductor substrate.

14. The method according to claim 1, wherein implanting the defined dose of protons into the semiconductor substrate comprises implanting a defined dose of protons into a drift layer region of the semiconductor device to be formed.

15. The method according to claim 14, further comprising implanting or diffusing carbon into a field stop layer region of the semiconductor device to be formed so that an average carbon concentration within the drift layer region is lower than an average carbon concentration within the field stop layer region.

16. The method according to claim 1, wherein the carbon-related parameter is a CiOi concentration or an absorption constant, wherein the-CiOi concentration is determined by a deep-level transient spectroscopy measurement, and wherein the absorption constant is determined by an infrared measurement.

* * * * *